United States Patent
Weeks et al.

(10) Patent No.: US 9,099,423 B2
(45) Date of Patent: Aug. 4, 2015

(54) DOPED SEMICONDUCTOR FILMS AND PROCESSING

(71) Applicant: ASM IP HOLDING B.V., Almere (NL)

(72) Inventors: Keith Doran Weeks, Gilbert, AZ (US); John Tolle, Gilbert, AZ (US); Matthew G. Goodman, Chandler, AZ (US); Sandeep Mehta, Scottsdale, AZ (US)

(73) Assignee: ASM IP HOLDING B.V. (NL)

( * ) Notice: Subject to any disclaimer, the term of this patent is extended or adjusted under 35 U.S.C. 154(b) by 0 days.

(21) Appl. No.: 14/143,719

(22) Filed: Dec. 30, 2013

(65) Prior Publication Data

US 2015/0014816 A1 Jan. 15, 2015

Related U.S. Application Data

(60) Provisional application No. 61/845,900, filed on Jul. 12, 2013.

(51) Int. Cl.
*H01L 29/36* (2006.01)
*H01L 21/02* (2006.01)
*H01L 21/306* (2006.01)

(52) U.S. Cl.
CPC ............ *H01L 29/36* (2013.01); *H01L 21/0262* (2013.01); *H01L 21/02532* (2013.01); *H01L 21/02576* (2013.01); *H01L 21/30604* (2013.01)

(58) Field of Classification Search
CPC .............. H01L 21/0257; H01L 29/167; H01L 21/30604; H01L 21/02524; H01L 29/36; H01L 21/0262; H01L 21/02664
See application file for complete search history.

(56) References Cited

U.S. PATENT DOCUMENTS

| | | |
|---|---|---|
| 5,766,999 A | 6/1998 | Sato |
| 6,190,976 B1 | 2/2001 | Shishiguchi et al. |
| 6,613,695 B2 | 9/2003 | Pomarede et al. |
| 6,821,851 B2 * | 11/2004 | Hergenrother et al. ....... 438/268 |
| 6,881,633 B2 | 4/2005 | Hokazono |
| 6,974,730 B2 | 12/2005 | Diaz et al. |
| 6,998,305 B2 | 2/2006 | Arena et al. |
| 7,176,481 B2 | 2/2007 | Chen et al. |
| 7,335,959 B2 | 2/2008 | Curello et al. |
| 7,405,131 B2 | 7/2008 | Chong et al. |
| 7,759,199 B2 | 7/2010 | Thomas et al. |
| 8,278,176 B2 | 10/2012 | Bauer et al. |
| 8,367,528 B2 | 2/2013 | Bauer et al. |
| 2001/0046766 A1 | 11/2001 | Asakawa |
| 2002/0034864 A1 | 3/2002 | Mizushima |
| 2002/0052124 A1 | 5/2002 | Raaijmakers et al. |
| 2003/0230233 A1 | 12/2003 | Fitzgerald et al. |

(Continued)

OTHER PUBLICATIONS

Yushin et al., "Chapter 8 Carbide-Derived Carbon," Nanomaterials Handbook, CRC Press (2006), Philadelphia, Pennsylvania, 44 pgs.

*Primary Examiner* — Roy Potter
*Assistant Examiner* — Paul Patton
(74) *Attorney, Agent, or Firm* — Knobbe, Martens, Olson & Bear LLP (57) ABSTRACT

A method of forming a semiconductor material incorporating an electrical dopant is disclosed. In one aspect, a method of incorporating dopant in a semiconductor film comprises forming a first semiconductor material incorporating the dopant at a first dopant concentration and preferentially etching a portion of the first semiconductor material, wherein etching leaves a first etched semiconductor material incorporating the dopant at a second dopant concentration higher than the first dopant concentration.

28 Claims, 6 Drawing Sheets

(56) References Cited

U.S. PATENT DOCUMENTS

| | | |
|---|---|---|
| 2006/0038243 A1 | 2/2006 | Ueno et al. |
| 2006/0115934 A1 | 6/2006 | Kim et al. |
| 2006/0131665 A1 | 6/2006 | Murthy et al. |
| 2006/0166414 A1 | 7/2006 | Carlson et al. |
| 2006/0228842 A1 | 10/2006 | Zhang et al. |
| 2007/0287272 A1 | 12/2007 | Bauer et al. |
| 2009/0075447 A1 | 3/2009 | Meunier-Beillard et al. |
| 2011/0117732 A1 | 5/2011 | Bauer et al. |
| 2011/0124169 A1 | 5/2011 | Ye et al. |
| 2011/0147811 A1 | 6/2011 | Kavalieros et al. |
| 2011/0193178 A1 | 8/2011 | Chang et al. |
| 2011/0198591 A1 | 8/2011 | Meunier-Beillard et al. |
| 2011/0241110 A1 | 10/2011 | Xiao et al. |
| 2012/0244688 A1 | 9/2012 | Bauer et al. |
| 2012/0295427 A1 | 11/2012 | Bauer |
| 2013/0320429 A1 | 12/2013 | Thomas |

\* cited by examiner

DOPED SEMICONDUCTOR FILMS AND PROCESSING

BACKGROUND

1. Field of the Technology

The disclosed technology relates generally to semiconductor films and more particularly to semiconductor films incorporating dopants at desired concentrations.

2. Description of the Related Art

Highly doped semiconductor regions find many uses in various semiconductor devices. For example, in advanced transistor scaling (e.g., below about 20 node), such highly doped semiconductor regions may be advantageously used to form abrupt junctions, for example, to reduce short channel effects, by providing ultra-shallow source and drain junctions, such that loss of channel control by the gate due to source and drain depletion regions can be minimized. In three-dimensional transistors, for example in tri-gate or fin field effect transistors (finFETs), such highly doped semiconductor regions may provide strain in the channel of the finFETs that enhance the mobility of carriers, e.g., electrons in NMOS finFETs.

Formation of such highly doped semiconductor regions by many known techniques can result in certain undesirable effects. For example, the source and drain junctions formed by traditional techniques such as ion implantation results in a Gaussian distribution of dopants having a relatively large straggle, which can limit the abruptness of the junctions. In addition, the channeling of the dopant can lead to increase in the depth of the source and the drain, leading to short channel effects. Ion implantation is also limited in certain applications due to its tendency to destroy crystal structure, particularly for heavy doping steps. In other techniques, dopants are diffused into a semiconductor layer or substrate. For example, doped semiconductor material can be deposited adjacent to a channel region of a transistor and the dopants diffused in the semiconductor to form the source and drain regions. Both diffusion doping and any dopant activation step (which is also applicable to implantation) at high temperatures (e.g., greater than 800° C.) can lead to undesirable dopant distributions with less defined junctions as well as loss of desirable strain. Forming doped amorphous and polycrystalline semiconductor layers can raise similar issues.

In situ doping of semiconductor material involves incorporation of desired dopants during deposition. This technique can be advantageous in providing dopants within the layer with very high activated fractions while maintaining junction depth profile and abruptness. For example, transistor structures can have well-defined junctions formed by in situ doped epitaxial semiconductor deposition. In situ doping can also be useful for other semiconductor structures, such as contact regions, gate electrodes, interconnects, etc. However, known techniques are limited by deposition kinetics as to the amount of dopant that can be incorporated in situ.

Thus, there is a need for improved techniques for forming doped semiconductor regions.

SUMMARY OF THE INVENTION

In one aspect, a method of incorporating an electrical dopant at a high concentration in a semiconductor film comprises forming a first semiconductor material incorporating the dopant at a first dopant concentration and preferentially etching a portion of the first semiconductor material relative to the dopant, wherein preferentially etching leaves a first etched semiconductor material incorporating the dopant at a second dopant concentration higher than the first dopant concentration.

In another aspect, a method of forming a doped semiconductor includes depositing a semiconductor layer incorporating an electrical dopant. A concentration of the dopant is thereafter increased without adding electrical dopant.

In another aspect, a semiconductor device comprises an epitaxial semiconductor layer, where the epitaxial semiconductor layer has an electrically activated dopant at peak concentration greater than about $2.5 \times 10^{21}/cm^3$.

DETAILED DESCRIPTION OF THE EMBODIMENTS

One approach to forming a doped semiconductor is to deposit a semiconductor material that is heavily doped in-situ. In situ doping can advantageously minimize dopant diffusion and facilitate sharp interfaces with adjacent materials, for example providing well-defined junctions for transistors. Moreover, in-situ doping techniques described herein are capable of incorporating dopant atoms into lattice sites of the semiconductor material, i.e., substitutionally, without having to perform a separate dopant activation step, such as a thermal anneal process, such that the dopant can be electrically active as-deposited.

Figure 1:
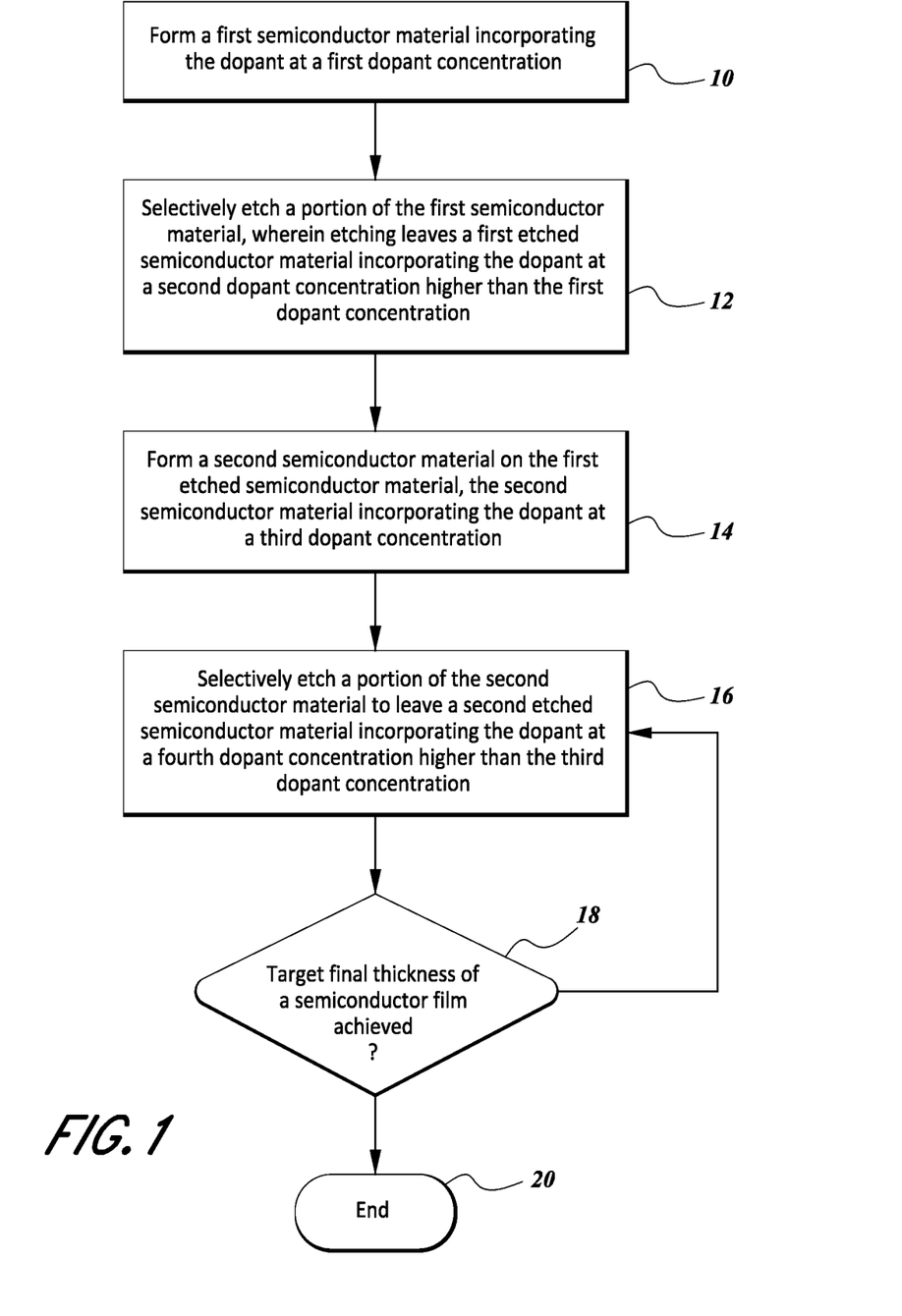
FIG. 1 is a flow chart illustrating a method of incorporating an electrical dopant in a semiconductor film according to one embodiment.

FIG. 1 illustrates a method of incorporating an electrical dopant in a semiconductor film through cyclical deposition and etch (CDE) processes. According to one embodiment, the method includes forming 10 a first semiconductor material on a substrate. The first semiconductor material has a first thickness and incorporating the dopant at a first dopant concentration. Deposition precursors can be discontinued and can also be purged from the reaction chamber prior to further processing. The method additionally includes preferentially etching 12 a portion of the first semiconductor material relative to the dopant. Preferentially etching 12 leaves a first etched semiconductor material having a second thickness smaller than the first thickness. The first etched semiconductor material incorporates the dopant at a second dopant concentration higher than the first dopant concentration. Accordingly to one embodiment, the process can end after conducting one deposition 10 and one preferential etch 12.

The semiconductor material can be amorphous, polycrystalline or epitaxial (single crystal). In embodiments, the dopant can be electrically active as deposited, without any activation anneal. The amount etched in each cycle will depend upon the amount of dopant concentration increase desired. According to some embodiments, preferentially etching 12 can remove greater than 50% of the first semiconductor layer, for example 80-95% by layer thickness. The selectivity of the preferential etch is such that the dopant is removed, if at all, at a much lower rate. Accordingly, the second dopant concentration can be greater than the first dopant concentration by more than about 20%, by more than 100% or even more than 300%, depending on the degree of selectivity and relative amount of the layer removed through preferential etching. The technique can be advantageous in situation where the desired final concentration is relatively high, for example higher than practically achievable without concentrating the dopant.

However, the technique of deposition and subsequent increase of dopant concentration is not limited to situations where the degree of dopant concentrations is high. That is, the technique can be implemented with any desired level of dopant concentration. For example, the deposition parameters can be decoupled from the desired dopant concentration due to the post-deposition upward tuning of dopant concentration. Accordingly the in situ doped deposition conditions can be tuned based on considerations other than dopant concentration, and if the dopant concentration by the selected deposition process is too low for the circuit needs, preferential etching can be employed (cyclically in stages) to increase the dopant concentration to the desired level. As an example, if the chosen deposition conditions can only achieve $5 \times 10^{20}$ atoms/cm$^3$ but a concentration of $6 \times 10^{20}$ atoms/cm$^3$ is desired, etch phases are manipulated to remove about 20% of each deposited film.

In one example of an actual experiment, phosphorus doped tensile strained epitaxial silicon was deposited using thirty (30) 10 second pulses of chemical vapor deposition, which is equivalent to 300 seconds of continuous deposition, resulting in 920 Å of with a phosphorus concentration of $1.79 \times 10^{21}$ atoms/cm$^3$ (3.6 atomic % of the film). Both chlorine (Cl$_2$) and HCl were used in experiments for preferential removal of silicon relative to phosphorus. By running the same process with introduction of 2 second preferential etch pulses between the 10 second deposition pulses in this example, around 90% of the semiconductor film was removed, but the phosphorus was removed at a lower rate to leave a phosphorus concentration of $5.75 \times 10^{21}$ atoms/cm$^3$ (11.5 atomic % of the film), an increase in concentration of 220%, or greater than three times the deposited concentration.

It is expected that, by sufficiently selective preferential etch chemistries and removal of a significant portion of each deposited film, electrical dopant concentrations of greater than 15 atomic %, and as high as 17-22 atomic %, may be achievable using the techniques taught herein.

According to another embodiment, the method additionally includes one or more additional cycles of cyclical deposition and etch (CDE). Where the process is conducted in one reaction chamber, the etchant reactants can be discontinued and can also be purged from the reaction chamber prior to further cycles. After the first preferential etch 12, the method includes forming 14 a second semiconductor material on the first etched semiconductor material having a third thickness and incorporating the dopant at a third dopant concentration. The method further includes preferentially etching 16 a portion of the second semiconductor material to leave a second etched semiconductor material having a fourth thickness and incorporating the dopant at a fourth dopant concentration higher than the third dopant concentration. The method further includes deciding 18 whether a target final thickness of the semiconductor film has been achieved. In the case that the target final thickness has been achieved, the method ends 20. On the other hand, in the case that the target final thickness has not been achieved, the method repeats forming 14 the second semiconductor material and preferentially etching 16 the portion of the second semiconductor material until it is decided 18 that a target final thickness has been achieved.

Conducting the deposition and etching to concentrate the dopant in cycles, as opposed to a single deposition and etch, permits formation of thicker layers through cycling with a higher dopant concentration than the deposition achieves, without sacrificing uniformity of dopant concentration. In contrast, initially depositing a much thicker material and etching to concentrate the dopant can result in a higher dopant concentration near the upper surface as compared to the lower surface. This is demonstrated by experimental results in FIG. 6, discussed in more detail below. CDE for concentrating the dopant, with each deposition phase depositing, e.g., less than 100 Å and each etch phase reducing the layer to, e.g., less than 20 Å, therefore allows for more uniformity of dopant concentration. On the other hand, if only a thin (e.g., less than 20 Å, particularly less than 15 Å) layer is desired, only a single cycle can be employed.

In some embodiments, a first cycle of the cyclical deposition and etch process comprises a first deposition phase including forming 10 the first semiconductor material and a first etch phase including preferentially etching 12 the portion of the first semiconductor material. In some embodiments, a second cycle of the cyclical deposition and etch process comprises a second deposition phase including forming 14 the second semiconductor material and a second etch phase including preferentially etching 16 the portion of the second semiconductor material. As used herein, a "first cycle" can be preceded by one or more cycles of the CDE cycles. When preceded by one or more cycles of the cyclical deposition, the phrase "first cycle" can refer to an nth cycle and the phrase "second cycle" can refer to (n+1)th cycle.

In some embodiments, the first cycle and the second cycle are performed under substantially similar conditions. That is, the first semiconductor material and the second semiconductor materials are formed under substantially the same conditions including deposition rate, deposition temperature, deposition pressure, reactant species, and reactant flows rates, among other process conditions. Similarly, preferentially etching the portion of the first semiconductor material and preferentially etching the portion of the second semiconductor material are performed under substantially the same conditions including etch rate, etch temperature, etch pressure, etchant species, and etchant flow rates, among other process conditions.

In other embodiments, the first cycle and the second cycle are performed under substantially different conditions for either the deposition phases and/or the etch phases. That is, the first semiconductor material and the second semiconductor materials can be formed under substantially different conditions with respect to at least one of deposition rate, deposition temperature, deposition pressure, reactant species, and reactant flows rates, among other process conditions. Similarly, preferentially etching the portion of the first semiconductor material and preferentially etching the portion of the second semiconductor material can be performed under substantially different conditions with respect to at least one of etch rate, etch temperature, etch pressure, etchant species, and etchant flow rates, among other process conditions.

In some embodiments, the first deposition phase and the first etch phase of the first cycle are sequential in time and can be intervened by, for example, an inert gas (e.g. $N_2$) purge process. In other embodiments, the first deposition phase and the first etch phase of the first cycle can at least partially overlap in time and not be intervened by a purge process. In this connection, in some embodiments, deposition species and etchant species can substantially coexist inside a reaction chamber. Moreover, the deposition phases can exclude etchant species, for non-selective or blanket deposition, or can include etchant species for selective or partially selective deposition on semiconductor materials relative to insulators or other amorphous materials. For example, as is known in the art, nucleation over insulators, such as silicon oxides or silicon nitrides, is slow such that overall CVD of semiconductor deposition rates over insulators tends to be slower than deposition over semiconductor windows. Accordingly, inclusion of etchant in the deposition phases can be tuned to result in less or no deposition over insulators while depositing in situ doped semiconductor material over exposed semiconductor materials.

FIGS. 2(a)-2(e) illustrate a semiconductor film incorporating an electrically activated dopant at a high concentration at various stages of the CDE process similar to those described in FIG. 1.

Figure 2A:
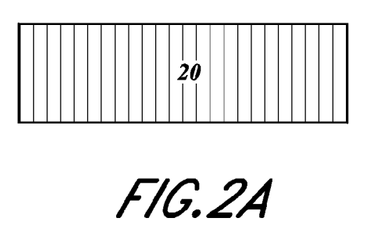
FIGS. 2(a)-2(e) illustrate a semiconductor film incorporating an electrical dopant at various stages of a cyclical deposition and etch processes according to one embodiment.

FIG. 2(a) illustrates a substrate 20. In some embodiments, the substrate 20 can include a single crystalline semiconductor material, such as a silicon wafer, which can be bare or patterned with insulating regions and bare semiconductor regions. In other embodiments, particularly for deposition of polycrystalline semiconductor material or an amorphous semiconductor material, the substrate can include structures thereover, such as semiconductor devices, interlevel dielectrics and/or interconnects, such that no single crystal material is exposed.

Figure 2B:
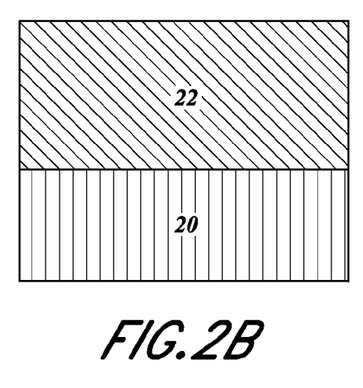

FIG. 2(b) illustrates a first semiconductor material 22 formed on the substrate 20 and incorporating a dopant at a first dopant concentration. In some embodiments, the first semiconductor is formed by a deposition technique such as physical vapor deposition (PVD), plasma-enhanced chemical vapor deposition (PECVD), low pressure chemical vapor deposition (LPCVD), molecular beam epitaxy (MBE), and atomic layer deposition (ALD), among others. In experiments described herein below, deposition was conducted by epitaxial CVD.

In some embodiments, the first semiconductor material 22 can include at least one group IV element, including silicon, germanium, tin and carbon. In some embodiments, the first semiconductor material 22 can be a binary alloy such as $Si_xGe_{(1-x)}$, $Si_xC_{(1-x)}$, $Si_xSn_{(1-x)}$, $Ge_xSn_{(1-x)}$, and $Ge_xC_{(1-x)}$, where x is between 0 and 1. The first semiconductor material 22 can also be a ternary alloy such as $Si_xGe_ySn_{(1-x-y)}$ and $Si_xGe_yC_{(1-x-y)}$. Under certain circumstances, the dopant concentration effect described herein can be greater when the first semiconductor material 22 does not include a substantial amount of carbon. Furthermore, highly doped films can attain the advantages of strain without scattering effects induced by carbon. In these embodiments, the first semiconductor material 22 can be a binary alloy that does not include carbon, such as $Si_xGe_{(1-x)}$, $Si_xSn_{(1-x)}$ and $Ge_xSn_{(1-x)}$, and/or a ternary alloy that does not include carbon, such as $Si_xGe_ySn_{(1-x-y)}$. Thus, in some embodiments carbon is either absent or present in amounts less than about 0.5 atomic %, more particularly less than about 0.1 atomic %. In some embodiments, the depositing gases can omit carbon precursors. In addition, the first semiconductor material 22 can be formed globally across an entire surface of the substrate, for example as a strain-relaxed buffer layer on a substrate, or can be formed within a localized region such as a gate region, a channel region, a source region, or a drain region of a transistor, among others.

In-situ dopant incorporation can be advantageous in fabricating many device features. For example, in transistor fabrication, abrupt source and drain junctions can be formed to minimize junction capacitances. In some embodiments, the dopant is electrically active as-deposited, without being subject to a subsequent thermal or an equivalent dopant activation step. Accordingly, such layers exhibit as-deposited dopant profiles with minimal diffusion into adjacent materials, in contrast to diffusion doped or ion implanted layers that require high temperature anneal treatment.

In some embodiments, the first semiconductor material 22 can be formed by depositing using a pulse or pulses in a chemical vapor deposition environment. The pulse can be a reactant pulse, for example, generated by interrupting the introduction of chemical reactants into a reaction chamber through controlling the valves. The pulses can be also be an energy pulse, for example, generated by interrupting the energy delivered to the substrate and/or the reaction chamber through electrical pulsing of a cathode of a plasma reactor.

In embodiments where the first semiconductor layer 22 includes silicon, semiconductor precursors delivered to a chemical vapor deposition chamber to deposit the first semiconductor layer 22 can include a silicon precursor, such as one or more of silane ($SiH_4$), dichlorosilane or DCS ($SiCl_2H_2$), disilane ($Si_2H_6$), monochlorodisilane (MCDS), dichlorodisilane (DCDS), trisilane ($Si_3H_8$), tetrasilane ($Si_4H_{10}$), isopentasilane ($Si^5H_{12}$), neopentasilane ($Si_5H_{12}$) or 2,2-dichlorotrisilane, among other possible silicon precursors. In some embodiments, the precursor comprising silicon can be introduced along with a germanium source, an electrical dopant source, or combinations thereof.

In embodiments where the first semiconductor layer 22 includes germanium, semiconductor precursors delivered to a chemical vapor deposition chamber to deposit the first semiconductor layer 22 can include a germanium precursor, such as one or more of monogermane ($GeH_4$), digermane ($Ge_2H_6$), higher order germanes such as trigermane or tetragermane or a suitable metallorganic precursor comprising Ge, among other possible germanium precursors.

In some embodiments a p-type or n-type electrical dopant precursor may be introduced into the reaction chamber with the semiconductor precursor to in-situ dope the first semiconductor layer 22. For p-doping the first semiconductor layer, an electrical dopant precursor comprising boron can be used, including diborane ($B_2H_6$) and boron trichloride ($BCl_3$) among others.

In some embodiments an n-type electrical dopant precursor may be introduced into the reaction chamber with the semiconductor precursor to in-situ dope the first semiconductor layer 22. For n-doping the first semiconductor layer, an electrical dopant precursor comprising one or more of arsenic (As), phosphorus (P), and antimony (Sb) can be used. For example, precursors for arsenic, phosphorus, and antimony that can be used include arsine ($AsH_3$), phosphine ($PH_3$), and stibine ($SbH_3$), among other possible dopant precursors.

Of course the skilled artisan will appreciate that precursors can be employed that include both semiconductor and dopant elements. For example, trisilophosphine ($Si_3H_3P$) can supply both silicon and phosphorus atoms during deposition of the film, with or without additional silicon and/or phosphorus precursors.

In an epitaxial growth, the amount of electrically active dopants that are incorporated into the first semiconductor layer 22 can depend on several factors including thermodynamic factors as well as kinetic factors during growth. An equilibrium solid solubility of dopants in a semiconductor material can be an indication of the amount of dopants that can be incorporated in the semiconductor material at a given temperature and pressure, especially in systems where kinetic factors such as atomic mobility is not a significant limiting factor in determining the amount of dopants a semiconductor material can retain. In many situations, however, kinetic factors such as atomic mobility can play a significant role. Under these circumstances, factors that can be significant in determining the amount of dopants incorporated into the semiconductor material can include fluxes of the species incident on a surface, retention probability of the species delivered to the surface, atomic diffusion, and surface segregation of the dopant species.

In some embodiments, the flow rates of the reactant species at a given total pressure can be controlled to achieve a particular result of the first semiconductor material. Without being bound to any theory, the flow rates can be related to the relative fluxes of the semiconductor species and the dopant species incident on the surface during the formation of the doped first semiconductor layer 22. The relative fluxes can be generally proportional to the flow rates of the reactant species at a given total pressure. In one embodiment, for a single wafer, 300-mm cross-flow reactor, a silicon precursor (e.g., trisilane ($Si_3H_8$)) can be introduced into the reaction chamber at a flow rate between about 10 mg/min and 100 mg/min, for instance about 50 mg/min. In one embodiment, for a single wafer, 300-mm cross-flow reactor, a dopant (e.g. phosphorus) precursor can be introduced at a flow rate between about 500 sccm and 3500 sccm, for instance about 1000 sccm, 2000 sccm or 3000 sccm.

In addition, the total pressure of the reaction chamber during the deposition of the first semiconductor material 22 can be controlled to achieve a particular result of the first semiconductor material 22. Without being bound to any theory, the total pressure can be related to absolute fluxes and the directionality of reactant species. In one embodiment, the total pressure in the reaction chamber can be controlled at a pressure between about 1 and 100 Torr, for instance about 30 Torr.

In addition, an inert gas can be introduced into the reactor chamber to achieve a desired total pressure independent of the partial pressures of the precursor species. An inert gas can include, for example, $N_2$ and Ar. In one embodiment, for a single wafer, 300-mm cross-flow reactor, inert gas can be introduced into the reaction chamber at a flow rate between about 0.5 slm and 2.5 slm, for instance about 1 slm.

In embodiments, the substrate temperature employed will depend, among other things, upon the choice of precursors. Lower deposition temperatures can better control dopant profiles and preserve thermal budget. Use of precursors having relatively higher reactivity, such as DCS or trisilane, can enable deposition at relatively lower temperatures. In some embodiments, the first semiconductor material can be deposited, for example, within the temperature range between about 350° C. and 550° C., more particularly between about 350° C. and 485° C., for instance about 465° C. For some embodiments, temperatures are in the range of about 400° C. and 500° C.

In embodiments, the deposition rate of the first semiconductor material 22 can be controlled to achieve a particular result of the first semiconductor material 22. Generally, the degree of incorporation of impurity atoms in the bulk without being segregated to the surface can be proportional to the deposition rate. The degree of incorporation of impurity atoms in the bulk can be expressed, for example, by a segregation coefficient. Choice of reactive precursors, such as DCS or trisilane, can also enable high deposition rates at relatively low temperatures. In one embodiment, the growth rate can be between about 0.1 Å/sec and about 10 Å/sec, for instance about 3 Å/sec.

In addition, when forming the highly doped first semiconductor material 22 includes forming by a pulsed deposition, a reactant pulse time can be controlled to more accurately control the thickness of the first semiconductor material 22. In one embodiment, a pulse duration of deposition is between about 1 and 30 seconds, for instance 10 seconds. In one embodiment, the thickness of the first semiconductor material 22 resulting from a reactant pulse is between about 1 Å to about 50 Å, for instance about 30 Å.

Through optimization of various factors as described above, the amount of electrically active dopants in the first semiconductor material 22 can be controlled within a range suitable for a particular use. Advantageously, the processes described herein enable the dopant concentration from the deposition phase to be independent from the final (higher) concentration, despite the fact that no further dopants are added. Thus, depositing need not be tuned for the desired concentration and can be tuned for other considerations (e.g., selectivity of deposition, composition of semiconductor compounds, etc.) while the subsequent preferential etch can increase the dopant concentration to a desired level.

Figure 2C:
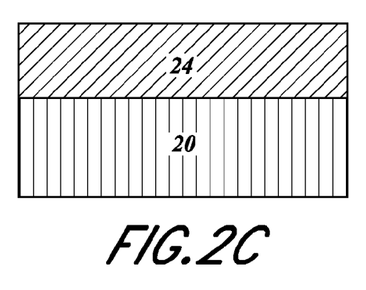

FIG. 2(c) illustrates the first semiconductor material 22 after being preferentially etched to remove a portion of the first semiconductor material, leaving a first etched semiconductor material 24 that incorporates the dopant at a second dopant concentration higher than the first dopant concentration. As used herein, "preferential etching" refers to a process wherein the semiconductor atoms are preferentially removed from the surface of the semiconductor material relative to the rate of removal of the dopant atoms, thereby accumulating the dopant atoms in the remaining etched semiconductor material.

In preferential etching, the relative amounts of semiconductor atoms and dopant atoms that are removed from the surface of the first semiconductor layer 22 can depend on several factors including thermodynamic factors as well as kinetic factors. For example, an equilibrium reaction rate between the solid phase semiconductor and dopant atoms (e.g., Si(s) and P(s)) and a gas phase etchant (e.g., $Cl_2(g)$) to form a volatile bi-product (e.g., $SiCl_4$ (g) and $PCl_3$ (g)) can be an indication of the relative amounts of the semiconductor atoms and dopant atoms that can be removed from the first semiconductor material at a given temperature and pressure. Other factors that can be significant in determining the amount of dopants incorporated into the semiconductor material can include fluxes of the etchant species incident on a surface and kinetic energies of the dopant etchant species delivered to the surface, and surface coverage ratio of the semiconductor atoms to dopant atoms, among others.

Various etchants can be provided during preferential etching, depending upon the semiconductor material and the dopants. In some embodiments, etchant species comprise at least one of a halide, such as a fluorine-, chlorine-, bromine- or iodine-containing vapor compound. In embodiments where etchant species include a chlorine containing compound, the chlorine containing compound can include $Cl_2$. In some embodiments where etchant species includes $Cl_2$, the etchant chemistry does not include HCl. Moreover, the etch chemistry can also omit germanium compounds such as $GeH_4$, which are sometimes used to improve etch rates. While such germanium compounds can enhance etch rates for carbon-containing materials, they can be deleterious for preferentially leaving dopants in the film.

In embodiments, flow rates of the etchant species can be controlled at a given total pressure to achieve a particular result of the etched first semiconductor material 24. Without being bound to any theory, the flow rates can be proportional to the flux of the etchant species incident on the surface of the first semiconductor material 22. In one embodiment, a gas phase etchant such as $Cl_2$ can be introduced into a single-wafer, 300-mm cross-flow reaction chamber at a flow rate between about 10 sccm and 500 sccm, for instance about 150 sccm.

In addition, the total pressure of the reaction chamber during preferential etching can be controlled to achieve a particular result of the etched first semiconductor material 24. Without being bound to any theory, the total pressure can be related to the directionality and energies of etchant species resulting from atomic collisions prior to reaching the surface of the first semiconductor material being etched. In one embodiment, the total pressure in the reaction chamber can be controlled at a pressure between about 1 Torr and 100 Torr, for instance about 30 Torr.

In addition, an inert gas can be introduced into the reactor chamber to achieve a desired total pressure independent of the partial pressure of the etchant species. In one embodiment, inert gas (e.g., molecular nitrogen $N_2$) can be introduced into the reaction chamber at a flow rate between about 1 slm and 30 slm, for instance about 20 slm.

In embodiments, the substrate temperature during preferentially etching a portion of the first semiconductor 22 can be chosen to achieve a particular result of the etched first semiconductor material 24. Without being bound to any theory, the reaction probabilities between the etchant species and the surface semiconductor and dopant atoms can be related to the substrate temperature. In one embodiment, the substrate temperature can be maintained between about 350° C. and about 550° C., such as between about 350° C. and about 485° C. for instance about 465° C. For some embodiments, temperatures are in the range of about 400° C. and 500° C. In some embodiments, reactants and conditions are chosen to such that substantially the same temperature can be maintained during the deposition phases and the etch phases. In other embodiments, the temperature may be changed between the deposition phases and the etch phases.

The relatively low substrate temperatures can be beneficial for in situ doping to advantageously provide abrupt interfaces against adjacent materials, such as, for example, an interface between a source or a drain region and a channel region of a transistor. As used herein, "abrupt" refers to a configuration where a boundary region interposed between a highly doped semiconductor region and an adjacent (differently doped or undoped) region includes a diffused concentration profile of the dopant that decays from a peak concentration to about 1/e times the peak concentration within a thickness as low as about 50 angstroms measured in a direction perpendicular to an interface between the in-situ doped region and an adjacent region, e.g., a well region. The boundary regions can have a thickness as low as about 50 angstroms, for example, when processing temperatures for the in-situ doped region as well as subsequent temperatures remain, for example, below about 600° C. The skilled artisan will appreciate, however, that the processes taught herein can also be implemented in combination with high temperature deposition (e.g., 900-1000° C.), in which case more diffusion can be expected.

In embodiments, the etch rate of the first semiconductor material 22 can be controlled to achieve a particular result of particular result of the etched first semiconductor material 24. Without being bound to any theory, due to different etch rates (e.g., due to different activation energies) of the semiconductor atoms compared to the dopant atoms, an overall etch rate can be an indication of relative etch rates of the semiconductor atoms and the dopant atoms. In one embodiment, the etch rate can be between about 1 Å/sec and about 40 Å/sec, for instance about 10 Å/sec.

In addition, an etchant pulse time can be controlled during the etch phase of a cycle to more accurately control the etch rate. In one embodiment, an etch pulse duration of is between about 0.1 and about 6 seconds, for instance 2 seconds. In one embodiment, the amount of removed thickness of the first semiconductor layer 22 resulting from an etch pulse is between about 1 Å and about 100 Å, for instance about 20 Å.

Through optimization of various deposition and preferential etch parameters as described above, the amount of electrically active dopants incorporated into the second etched semiconductor layer can be controlled to achieve a particular result of the etched first semiconductor material 24. In one embodiment, the resulting first etched semiconductor material 24 has a first electrically active concentration can be concentrated from a suitable lower concentration of the first semiconductor material 22 to a higher concentration. In another embodiment, the resulting first etched semiconductor material 24 has a first electrically active concentration that is higher than the first semiconductor material 22 by greater than about 20%, by more than 100% or even more than 300%. As described below, the technique is capable of achieving very high concentrations, including higher than $2.5 \times 10^{21}$ atoms/cm$^3$ up to about $10^{22}$ atoms/cm$^3$, e.g., between about $5 \times 10^{21}$ atoms/cm$^3$ and $7 \times 10^{21}$ atoms/cm$^3$. As discussed above, however, the technique of deposition and subsequent increase of dopant concentration is not limited to such high dopant concentrations, and can be advantageous for any desired level of dopant concentration. For example, the deposition parameters can be decoupled from the desired dopant concentration due to the post-deposition tuning of dopant concentration.

Figure 2D:
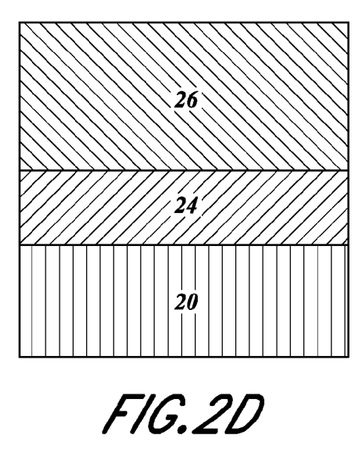

FIG. 2(d) illustrates a second semiconductor material 26 formed on the first etched semiconductor material 24 and incorporating a dopant at a third dopant concentration. As discussed above in connection with FIG. 1, in some embodiments, the first and second semiconductor materials are formed under substantially the same conditions including deposition rate, deposition temperature, deposition pressure, reactant species, and reactant flows rates, among other process conditions, while in other embodiments the first and second semiconductor materials are formed under substantially different conditions. In both circumstances, the conditions described in connection with the first semiconductor material 22 formed on the substrate 20 in FIG. 2(b) can similarly apply to the conditions for forming the second semiconductor material 26 in FIG. 2(d).

Figure 2E:
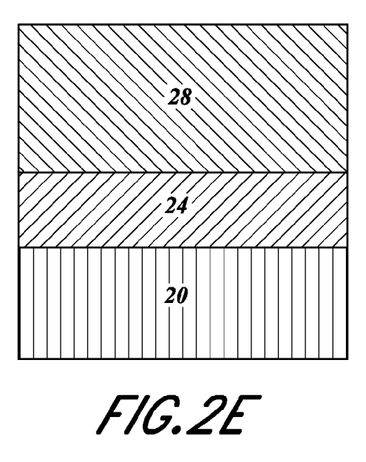

FIG. 2(e) illustrates the second semiconductor material 26 after being preferentially etched to remove a portion of the second semiconductor material, leaving a second etched semiconductor material 28 that incorporates the dopant at a fourth dopant concentration higher than the third dopant concentration. As discussed above in connection with FIG. 1, in some embodiments, preferentially etching portions of the first and second semiconductor materials are performed under substantially the same conditions including etch rate, etch temperature, etch pressure, etchant species, and etchant flow rates, among other process conditions, while in other embodiments preferentially etching portions of the first and second semiconductor materials are performed under substantially different conditions. In both circumstances, the conditions described in connection with preferentially etching to remove a portion of the first semiconductor material 22 in FIG. 2(c) can similarly apply to the conditions for forming the second etched semiconductor material 28 in FIG. 2(e).

Figure 3:
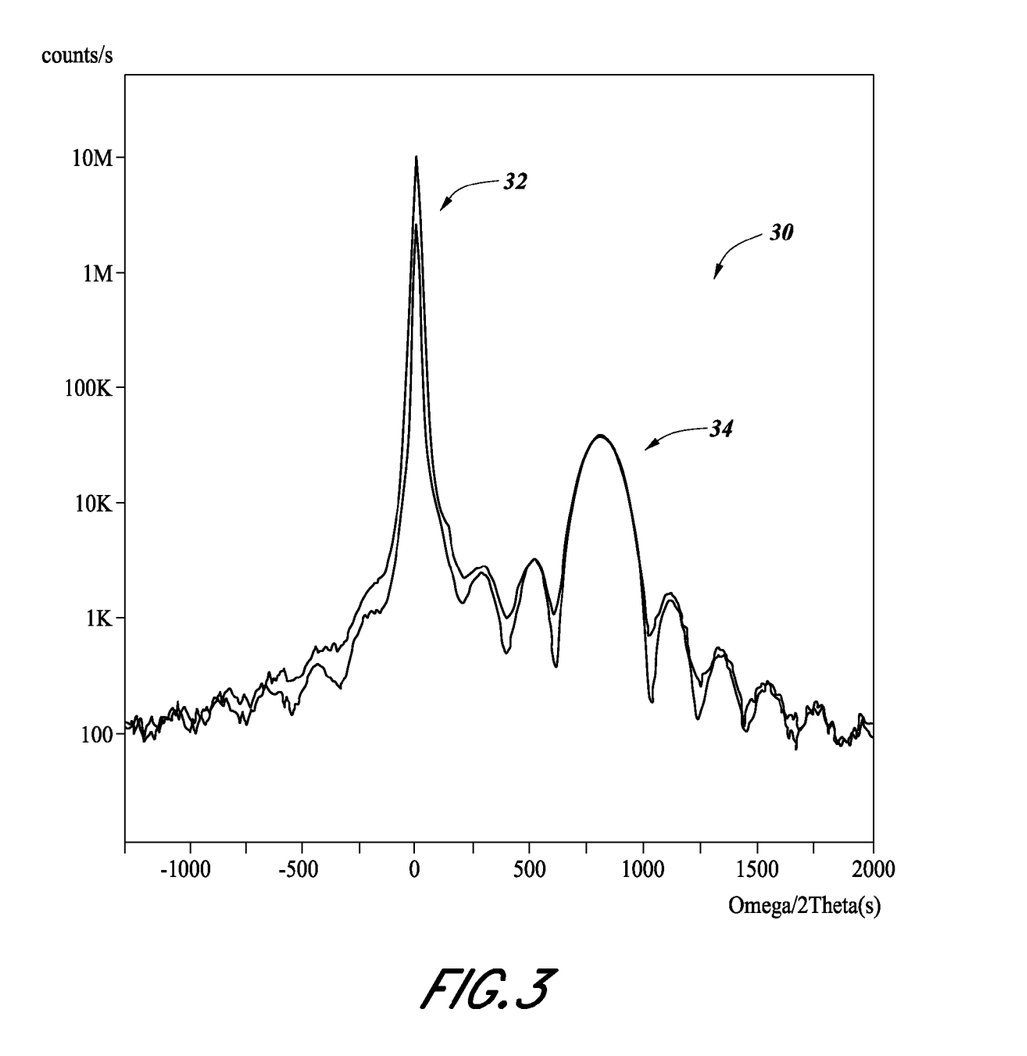
FIG. 3 is an X-ray rocking curve of a semiconductor film incorporating electrically active dopant formed by deposition alone, without preferential etching.

FIG. 3 illustrates an X-ray rocking curve 30 of a semiconductor material incorporating electrically active dopant by deposition alone, without preferential etching, such as forming step 10 of FIG. 1 or first semiconductor 22 of FIG. 2(b). The rocking curve 30 includes a substrate peak 32 attributable to a (100) Si substrate and a film peak 34 attributable to the semiconductor material formed on the Si substrate. The semiconductor material was formed using a deposition process including a plurality of cycles where each cycle included a deposition phase similar to that described above in connection with FIGS. 2(b) and (d) but did not include an etch phase similar to that described above in connection with FIGS. 2(c) and 2(e). The semiconductor material formed during the deposition phase was Si doped in-situ with P on a (100) Si substrate under deposition conditions including a temperature of 465° C., a pressure throttled at 30 Torr, a trisilane ($SiH_3$) flow rate of about 50 mg/min, a phosphine ($PH_3$) flow rate of 3000 sccm, and an $N_2$ flow rate of 1.5 slm. The semiconductor material was obtained after 30 deposition phases where each phase had a duration of about 10 seconds, followed by an intervening purge process during which only $N_2$ was flowing. The 30 depositions are equivalent to 300 seconds of continuous deposition, as no etch phase intervened. The resulting thickness was measured to be about 920 Å. Based on the position of the film peak, the semiconductor was determined to have about $1.8 \times 10^{21}$ P atoms/cm³, which corresponds to about 3.6 atomic percent of substitutional P in a single crystalline Si film.

Figure 4:
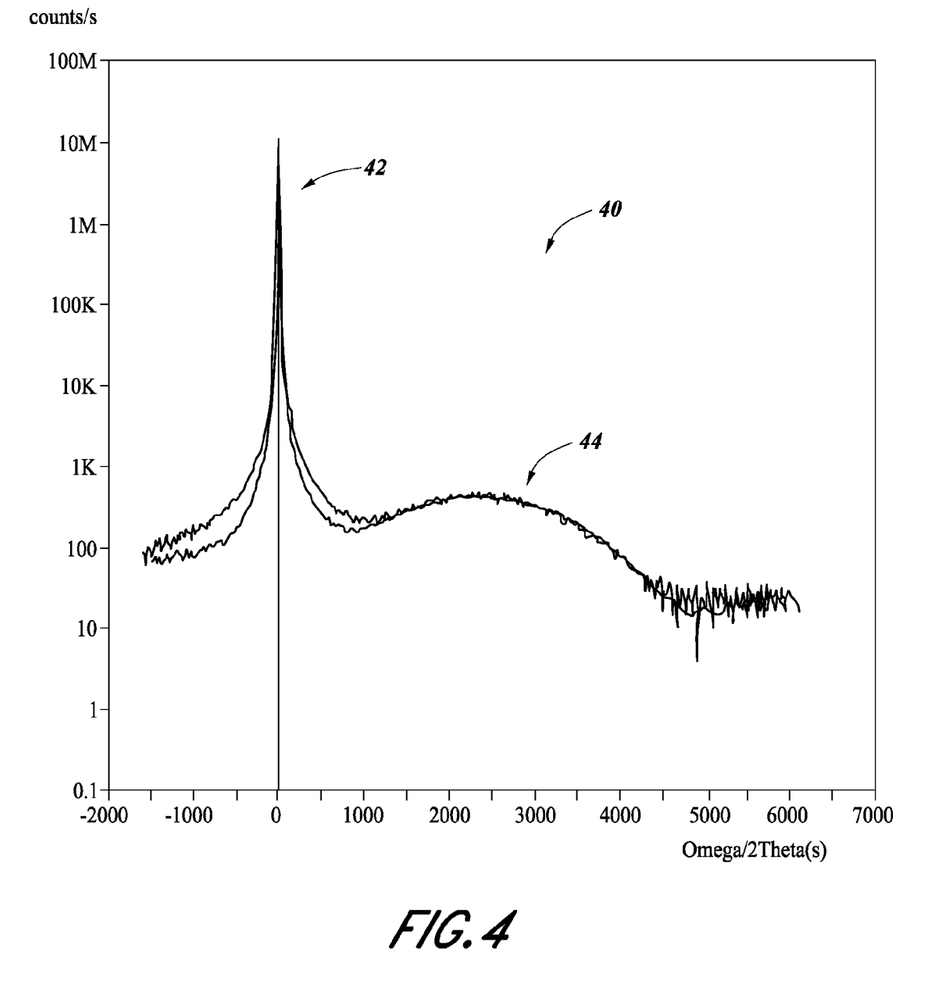
FIG. 4 an X-ray rocking curve of a semiconductor film incorporating electrically active dopant formed by deposition and preferential etch phases to concentrate the dopant, according to an embodiment.

FIG. 4 illustrates an X-ray rocking curve 40 of a semiconductor material incorporating electrically active dopant formed by preferentially etching between deposition phases used to form the film of FIG. 3 to concentrate the dopant, according to an embodiment. Similar to FIG. 3, the rocking curve 30 includes a substrate peak 42 attributable to a (100) Si substrate and a film peak 44 attributable to the semiconductor material formed on the Si substrate. Unlike FIG. 3, the semiconductor material of FIG. 4 was formed using a CDE process including a plurality of cycles where each cycle included a deposition phase similar to that described above in connection with FIGS. 2(b) and (d) and also included an etch phase similar to that described above in connection with FIGS. 2(c) and 2(e). Similar to FIG. 3, the semiconductor material formed during the deposition phase was Si doped in-situ with P on a (100) Si substrate under deposition conditions including a temperature of 465° C., a pressure throttled at 30 Torr, a trisilane flow rate of mg/min, a phosphine ($PH_3$) flow rate of 3000 sccm, and an $N_2$ flow rate of 1.5 slm. In addition, the semiconductor material was etched during the etch phase under etch conditions including a temperature of 465° C., a pressure throttled at 30 Torr, a chlorine ($Cl_2$) flow rate of 150 sccm, and an $N_2$ flow rate of 20 slm. The semiconductor material was obtained after 30 cycles where each cycle included a deposition phase having a duration of about 10 seconds and an etch phase having a duration of about 2 seconds. Between each phases, an intervening purge process was performed, during which only $N_2$ was flowing. The semiconductor material was obtained after 30 cycles. The resulting thickness was measured to be about 90 Å. Based on the position of the film peak, the semiconductor was determined to have about $5.75 \times 10^{21}$ P atoms/cm³, which corresponds to about 11.5 atomic percent of substitutional P in a single crystalline Si film.

Figure 5:
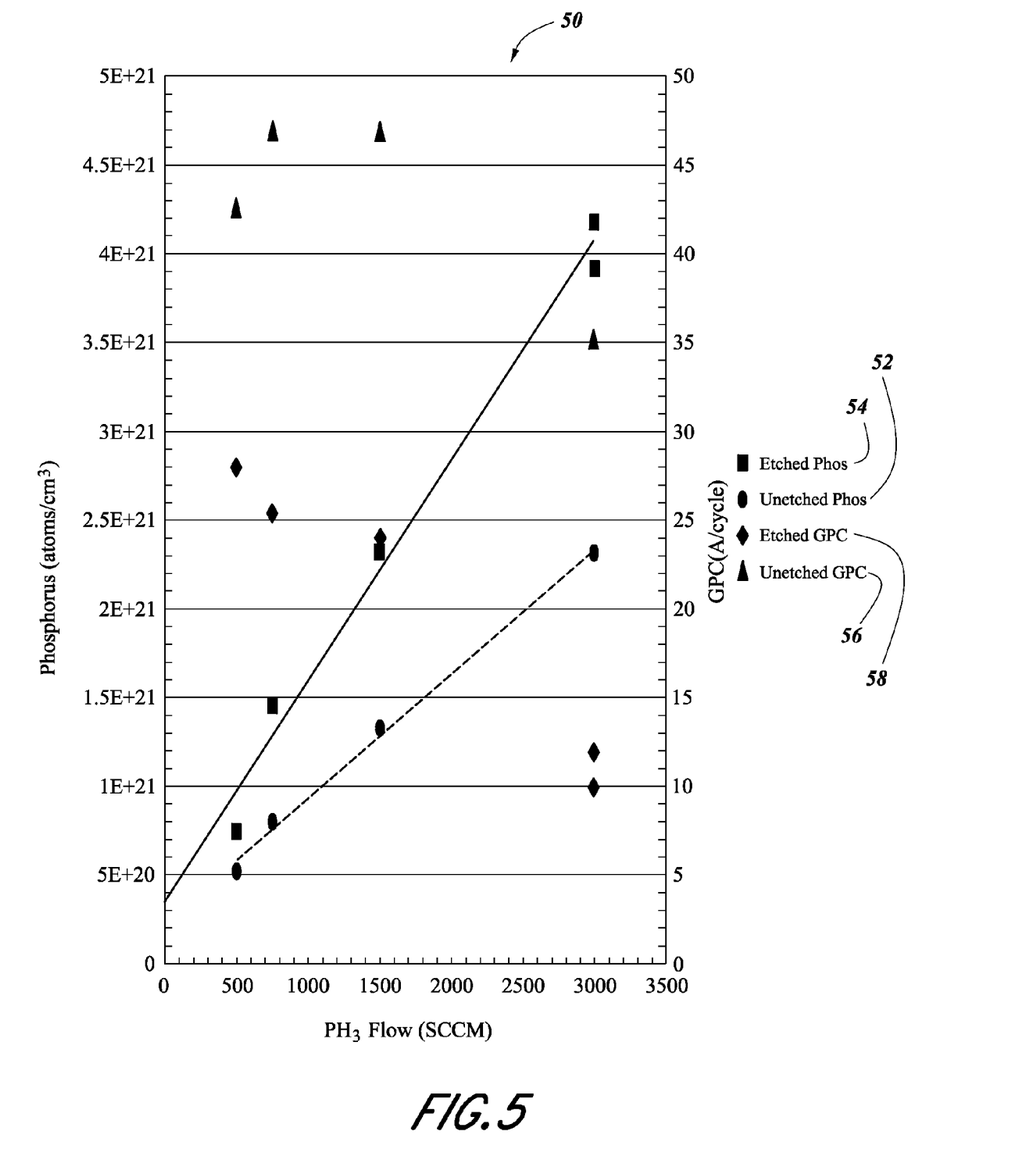
FIG. 5 is a graph illustrating dopant concentrations and growth rates of embodiments plotted as functions of dopant gas flow rate.

FIG. 5 is a graph 50 illustrating the dependence of dopant concentration and growth rate of semiconductors materials incorporating electrical dopant formed according to embodiments, plotted as a function of dopant gas flow rate. The x-axis of the graph 50 represents the flow rate of $PH_3$ in sccm. The first and second axes of the graph 50 represent an average phosphorus concentration of the semiconductor material and the growth rate expressed in Å per cycle, where one cycle includes a 10 second deposition phase and a 2 second etch phase, as described above for embodiments in FIGS. 3 and 5. Except for the $PH_3$ flow rate, other process parameters are within the process regimes discussed above in connection with FIGS. 2(a)-2(e). Symbols 52 represent electrically active phosphorus concentrations corresponding to semiconductor films formed with deposition alone, similar to the semiconductor film of FIG. 3. Symbols 54 represent electrically active phosphorus concentrations corresponding to semiconductor films formed with deposition and etch phases alone, similar to the semiconductor film of FIG. 4. As illustrated, for the $PH_3$ flow rate ranging from 500 sccm to 3000 sccm, including the etch phase in each cycle results in an increase in electrically active phosphorus concentration between about 50% and 100%.

Still referring to FIG. 5, symbols 56 represent growth rates corresponding to semiconductor films formed with deposition phases alone, similar to the semiconductor film of FIG. 3. Symbols 58 represent growth rates corresponding to semiconductor films formed with cycles including deposition phases and etch phases, similar to the semiconductor film of FIG. 4.

Figure 6:
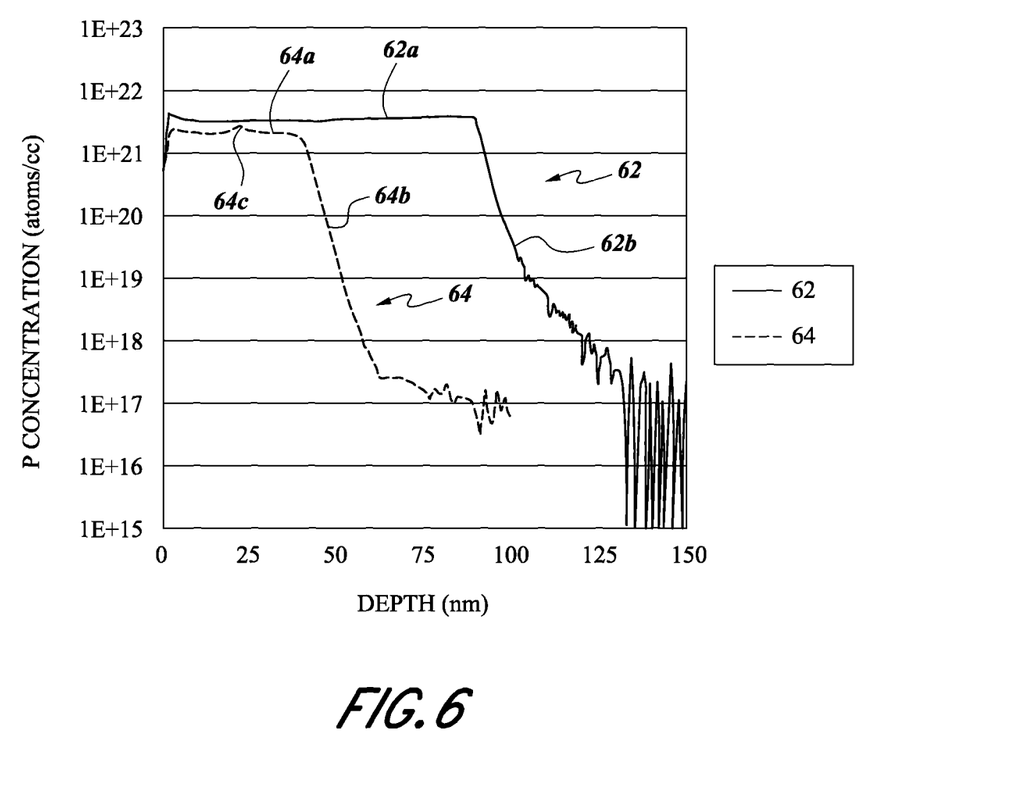
FIG. 6 is a graph illustrating dopant concentrations of embodiments plotted as functions of the depth of the semiconductor materials.

FIG. 6 illustrate experimental secondary ion mass spectroscopy (SIMS) depth profile results of semiconductor materials incorporating electrically active dopant formed by preferential etching between deposition phases to concentrate the dopant, according to embodiments. A SIMS depth profile can measure the concentration of an element as a function of depth by measuring the flux of sputtered atoms of the element as a film including the element is sputtered. In particular, FIG. 6 illustrates, as discussed above, that conducting the deposition and etching to concentrate the dopant in cycles, as opposed to a single deposition and etch, permits formation of thicker layers through cycling with a higher dopant concentration than the deposition achieves, without sacrificing uniformity of dopant concentration. A first SIMS depth profile 62 represents the concentration profile of phosphorus for a first semiconductor film deposited by performing 75 cycles comprising 75 deposition phases each having a duration of 13 seconds and 75 etch phases each having a duration of 2 seconds. The first SIMS depth profile 62 has a plateau region 62a, representing a phosphorus concentration profile in the first semiconductor film and a decay region 62b, representing a phosphorus concentration profile near the interface between the first film and the substrate. As illustrated, the plateau region 62a is relatively constant without noticeable local peaks. Furthermore, the decay region 62b is relatively sharp, in contrast to diffusion doped dopant profiles. In fact the as-deposited dopant profile would have an even sharper or more abrupt interface than indicated by the decay region 62b of the SIMS analysis. As will be appreciated by the skilled artisan, the SIMS process employs sputtering that has a side-effect of driving atoms from the deposited layer deeper into the underlying substrate in the course of sputtering, such that the SIMS analysis indicates more dopant in the substrate below the deposited layer than exists prior to the SIMS analysis.

A second SIMS depth profile 64 represents the concentration profile of phosphorus for a second semiconductor film deposited by performing two deposition phases each having a duration of 120 seconds and one intervening etch phase having a duration of 2 seconds. As in the first SIMS depth profile, the second SIMS depth profile 64 has a plateau region 64*a*, representing a phosphorus concentration profile in the first semiconductor film and a decay region 64*b*, representing a phosphorus concentration profile near the interface between the first film and the substrate. In addition, the second SIMS depth profile 64 additionally has a localized peak concentration region 64*c*, representing phosphorus concentration near the film location of the second deposition phase.

It will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

What is claimed is:

1. A method of incorporating an electrical dopant in a semiconductor film through cyclical deposition and etch, the method comprising:
    forming the semiconductor film incorporating the dopant atoms among semiconductor atoms, wherein the dopant atoms are incorporated at a first dopant concentration; and
    etching a portion of the semiconductor film, wherein etching preferentially removes semiconductor atoms relative to the dopant atoms such that etching leaves a remaining portion of the semiconductor film having a second dopant concentration higher than the first dopant concentration.

2. A method of incorporating an electrical dopant in a semiconductor film through cyclical deposition and etch, the method comprising:
    forming a first semiconductor material incorporating the dopant at a first dopant concentration;
    preferentially etching a portion of the first semiconductor material, wherein preferentially etching leaves a first etched semiconductor material incorporating the dopant at a second dopant concentration higher than the first dopant concentration;
    forming a second semiconductor material on the first etched semiconductor material, the second semiconductor material incorporating the dopant at a third dopant concentration; and
    preferentially etching a portion of the second semiconductor material to leave a second etched semiconductor material incorporating the dopant at a fourth dopant concentration higher than the third dopant concentration.

3. The method of claim 2, wherein forming the first and second semiconductor materials comprises chemical vapor depositing in situ doped first and second silicon layers.

4. The method of claim 2, wherein the dopant comprises an n-type dopant.

5. The method of claim 2, wherein the dopant comprises phosphorus.

6. The method of claim 2, wherein forming the first and semiconductor materials and preferentially etching the portions of the first and second semiconductor materials are carried out at a substrate temperature between about 400° C. and about 500° C.

7. The method of claim 2, wherein forming the first and second semiconductor materials and preferentially etching the portions of the first and second semiconductor materials are carried out at a pressure between about 20 Torr and about 40 Torr.

8. The method of claim 2 wherein chemical vapor depositing the first semiconductor material includes incorporating the dopant to have the first electrically active concentration of between about $5\times10^{20}/cm^3$ and about $2.5\times10^{21}/cm^3$.

9. The method of claim 2, wherein a concentration of the dopants in the semiconductor film is between about $7\times10^{20}/cm^3$ and about $4.5\times10^{21}/cm^3$.

10. The method of claim 2, wherein chemical vapor depositing the first and second silicon layers includes epitaxially depositing.

11. The method of claim 2, wherein forming the first and second semiconductor material includes depositing for a duration between about 5 seconds and about 15 seconds.

12. The method of claim 11, wherein forming the first and second semiconductor materials include depositing a thickness between about 20 Å and about 60 Å.

13. The method of claim 2, wherein preferentially etching portions of the first and second semiconductor materials includes etching for a duration between about 1 and 3 seconds.

14. The method of claim 12, wherein preferentially etching portions of the first and second semiconductor materials includes etching a thickness between about 15 Å and about 55 Å.

15. The method of claim 2, wherein forming the first and second semiconductor materials comprises incorporating less than about 0.1 atomic % carbon.

16. The method of claim 2, wherein forming the first and second semiconductor materials comprises chemical vapor depositing doped first and second silicon layers using precursors that do not include a carbon containing precursor.

17. The method of claim 2, wherein preferentially etching the portion of the first semiconductor material and preferentially etching the portion of the second semiconductor material comprises using etchants that do not include a germanium source.

18. The method of claim 2, wherein preferentially etching the portion of the first semiconductor material and preferentially etching the portion of the second semiconductor material comprises using etchants that do not include hydrochloric acid (HCl).

19. A method of forming a doped semiconductor, comprising:
    depositing a semiconductor layer incorporating an electrical dopant; and
    subsequently increasing a concentration of the dopant without adding electrical dopant.

20. The method of claim 19, wherein increasing the concentration comprises preferentially etching such that semiconductor material is removed from the semiconductor layer at a higher rate than the dopant is removed.

21. The method of claim 19, wherein preferentially etching comprises removing more than 50% of the semiconductor material from the semiconductor layer.

22. A semiconductor device comprising:
    a substrate; and
    an as-deposited epitaxial semiconductor layer on the substrate, wherein the as-deposited epitaxial layer has a uniform dopant concentration exceeding about 15 atomic %.

23. The semiconductor device of claim 22, wherein the epitaxial semiconductor layer has a dopant profile characteristic of an as-deposited, in situ doped layer.

24. The semiconductor device of claim 22, wherein the epitaxial semiconductor layer comprises a strained single crystalline region.

25. The semiconductor device of claim 22, wherein the dopant comprises phosphorus.

26. The method of claim 1, wherein etching includes preferentially removing semiconductor atoms using an etchant including a halide-containing vapor compound.

27. The method of claim 26, wherein the etchant includes $Cl_2$.

28. The method of claim 27, wherein the etchant does not include HCl.

* * * * *

UNITED STATES PATENT AND TRADEMARK OFFICE
CERTIFICATE OF CORRECTION

PATENT NO. : 9,099,423 B2  
APPLICATION NO. : 14/143719  
DATED : August 4, 2015  
INVENTOR(S) : Keith Doran Weeks It is certified that error appears in the above-identified patent and that said Letters Patent is hereby corrected as shown below:

In the Claims

In column 13 at line 56, In Claim 6, change "and" to --and second--.

Signed and Sealed this  
Twenty-eighth Day of June, 2016

Michelle K. Lee  
*Director of the United States Patent and Trademark Office*